(12) United States Patent
Mehr

(10) Patent No.: US 6,452,444 B1
(45) Date of Patent: Sep. 17, 2002

(54) METHOD AND APPARATUS FOR BACKGROUND CALIBRATION OF ACTIVE RC FILTERS

(75) Inventor: Iuri Mehr, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/782,666

(22) Filed: Feb. 13, 2001

(51) Int. Cl.[7] ............................................... H03K 5/02

(52) U.S. Cl. ...................................................... 327/554

(58) Field of Search ................................. 327/553, 554, 327/362, 94, 337; 330/9

(56) References Cited

U.S. PATENT DOCUMENTS

| | | | |
|---|---|---|---|
| 4,509,019 A | | 4/1985 | Banu et al. .................. 330/107 |
| 4,733,205 A | * | 3/1988 | Hughes ....................... 333/172 |
| 4,785,253 A | | 11/1988 | Hughes ....................... 328/167 |
| 4,937,536 A | * | 6/1990 | Reinhardt et al. .............. 331/8 |
| 4,988,900 A | * | 1/1991 | Fensch ........................ 327/554 |
| 5,245,646 A | | 9/1993 | Jackson et al. ................. 377/2 |
| 5,625,316 A | | 4/1997 | Chambers et al. ........... 327/553 |
| 5,689,201 A | * | 11/1997 | Temes et al. .................. 327/95 |
| 5,914,633 A | | 6/1999 | Comino et al. .............. 327/553 |
| 6,097,244 A | | 8/2000 | Chen .......................... 327/553 |

\* cited by examiner

*Primary Examiner*—Dinh T. Le
(74) *Attorney, Agent, or Firm*—Samuels, Gauthier & Stevens, LLP

(57) ABSTRACT

A tunable, active RC filter and method of tuning the active RC filter which prevents distortions introduced during tuning. Generally, each tuning element in the feedback loop of the tunable active RC filter comprises a capacitor, a first switch, a second switch, and a third switch. The first switch connects a first terminal of the capacitor to a summing junction at the input of the op-amp when closed. When closed, a second switch connects the first terminal of the capacitor to a replica of the voltage present at the summing junction (input) of the op-amp to which the first terminal of the reactance element is connectable via the first switch. A third switch, when closed, connects the first terminal of the capacitor to the second terminal of the reactance element, which is connected the output of the op-amp. By connected the capacitor to the replica voltage via the second switch prior to connecting it to the summing junction at the input of the op-amp, the capacitor is pre-charged to the voltage it would have if present in the feedback path. Therefore, as the capacitor is pre-charged, the output voltage of the op-amp is not presented to the summing junction when the capacitor is switched in, which substantially eliminates the distortions caused by connecting the capacitors to the summing junction. The third switch is utilized to short the capacitor when it is disconnected from the summing junction.

15 Claims, 5 Drawing Sheets

Element switch in sequence:

Element switch-out sequence:

METHOD AND APPARATUS FOR BACKGROUND CALIBRATION OF ACTIVE RC FILTERS

BACKGROUND OF THE INVENTION

The present invention relates generally to the field of active RC filters. More specifically, the present invention is related to calibrating active RC filters by switching capacitors into and out of the feedback path.

Active RC filters are used in a number of analog processing applications. A typical one-pole active RC filter is illustrated in FIG. 1a. Differential active RC filter 100 comprises an operational amplifier (op-amp) 106, resistors 108a and 108b and capacitors 102a and 102b located in the feedback paths of op-amp 106. Differential active RC filter 100 also comprises resistors 104a and 104b located in the input paths of op-amp 106. To provide a differential active RC filter, a balanced amplifier is utilized. This amplifier is a double-input, double-output operational amplifier. For amplifiers of this type, the input signals Vinp and Vinn are required to be substantially equal in magnitude and opposite in sign when compared to the same reference voltage that defines the outputs of active filter 100. The reference voltage defining the outputs is the signal ground potential, which is the same, or different, as the power supply ground, depending upon the circuit configuration in which active filter 100 is utilized. The use of such amplifiers has been found to provide a number of advantages, such as a reduction of total harmonic distortion, even when large device mismatches in the input transistors or in the values of the integrating capacitors 102a and 102b exist.

For low to medium ranges of frequencies, op-amp 106 has near infinite impedance and near infinite gain. As such, op-amp 106 draws a small amount of current, if any, and nearly the entirety of the input signal for these frequencies is applied to the reactance components 102a and 102b and resistors 108a and 108b. Because of this, for active RC filters, the time constant, and hence the frequency characteristics, is almost purely a function of the reactance components and resistors of the active RC filter.

FIG. 1b illustrates another example of an active RC filter. Shown is a biquad active RC filter 120 which is a second order (two-pole) filter. Similar to one-pole active RC filter 100, the frequency characteristics of biquad filter 120 are almost completely a function of reactance components 110a, 110b, 114a and 114b and resistors 112a, 112b, 116a and 116b.

Often, it is desirable to fabricate these active RC filters as monolithic integrated circuits. Consequently, during fabrication, the components of the filter are subject to process variations. In addition, during use, the components of the filter are subject to temperature and power supply variations. Because of these variations, the time constant, and hence the frequency characteristics, of an active RC filter can vary greatly from the nominal design value. One solution to these variations has been to utilize integrated amplifiers with external, precision components. However, this solution increases the size of the device and increases the cost of producing each device.

A number of other methods have been utilized to ameliorate the process, temperature and power supply variations which ultimately result in a variation of frequency characteristics. One such method is to place triode-mode (so as to act as variable resistors) MOS devices in series with the resistances in the active filter and control the gate of the MOS devices to vary the resistance to get the desired frequency characteristics. Another method involves replacing the resistors with an array of resistors which are switched in and out of the circuit to adjust the frequency characteristics. However, the use of the MOS devices increases non-linearities in the circuit. Resistors are more likely than other components to suffer from wide variations in value, and as such, there is difficulty in utilizing the array of resistors to properly set the frequency characteristics.

Yet another method to ameliorate the effects of variations is illustrated in FIG. 2. In this method, the capacitors are replaced with an array of capacitors. As illustrated, active filter 200 comprises an op-amp 206, resistors 204a and 204b and arrays of capacitors 202a and 202b. For each of the capacitors of capacitor arrays 202a and 202b, one terminal of the capacitor is connected to the corresponding output node of op-amp 206. The second terminal of the capacitor is connected to a switch, which, when closed, connects the second terminal of the capacitor to corresponding summing junction (op-amp input) 210a, 210b, switching the capacitor into the array. To adjust the frequency characteristics of active filter 200, each capacitor of the capacitor arrays 202a and 202b is switched in or out, with the resulting total capacitance switched into the circuit determining the frequency characteristics.

The prior art solutions using MOS devices, resistor arrays and capacitor arrays, as illustrated in FIG. 2, additionally utilize a master circuit 208 to apply the appropriate voltage to the gates of the MOS devices, or to switch feedback resistors or capacitors in the arrays in and out.

In order to determine which capacitors, in the case of the implementation of FIG. 2, are switched into and out of the circuit, master circuit 208 utilizes a stable reference clock and a replica of active RC filter 200. Master circuit 208 compares the time constant of the replicated active RC filter with the stable reference clock and, from this information, is able to determine the variation of the time constant of the replicated active filter from the nominal design time constant. Because variations in devices on a single integrated chip are minimal, the variation of the replicated active filter is essentially the same as any other active RC filters on the chip. By setting up a feedback loop based upon these comparisons, the active filters on the chip can be adjusted so as to be within tolerance of the nominal design frequency characteristics.

While these methods have made it possible to tune active RC filters, there exist drawbacks to each method. As previously described, the use of MOS devices introduces increased non-linearities into the active RC filter. Resistors are more likely to have wide process variations than other components, and therefore tuning of the active filter is more difficult with resistor arrays. However, even though capacitors may be more advantageous than the other solutions, the use of capacitor arrays has certain difficulties. Although errors due to process variations can be resolved before the filter starts normal operation by switching in and out the appropriate number of capacitors, temperature and supply voltage variations can occur at any time during the operation of the filter. Therefore, it is desirable to perform corrections during the use of the active filter. However, when the active filter is in use and a capacitor is switched into the circuit directly, the summing junction (input) of the op-amp is presented with the output voltage of the op-amp (signal voltage). This generates significant distortions in the inputs and outputs of the op-amp which have long settling times.

As a result there is still a need for a device and method to track variations in the time constant of an active RC filter without distortion due to the switching of reactance elements into and out of the feedback path of the active filter.

SUMMARY OF THE INVENTION

The present invention provides for a tunable, active RC filter and method of tuning the active RC filter which prevents distortions introduced during tuning. Generally, each tuning element in the feedback loop of the tunable active RC filter comprises a reactance element, a first switch, a second switch, and a third switch. The first switch connects a first terminal of the reactance element to a summing junction at the input of the op-amp. A second switch connects the first terminal of the reactance element to a replica of the voltage present at the summing junction (input) of the op-amp, to which the first terminal of the reactance element is connectable via the first switch. A third switch, when closed, connects the first terminal of the reactance element to the second terminal of the reactance element, which is connected to the output of the op-amp.

To tune the active filter, the reactance elements are switched into or out of the feedback path of the op-amp based upon a digital signal generated by a master circuit representing the number of elements to be switched in or out. The switching in of a single reactance element is performed using the three switches so as to substantially eliminate the distortion normally caused by switching a capacitor into the feedback path of the op-amp. Prior to being switched into the feedback path, the first and second switches are open, while the third switch is closed, shorting the capacitor so that it is discharged and does not load the op-amp output. In response to the digital signal generated by the master circuit, the third switch is opened and the second switch is closed, switching the capacitor to the replica of the voltage at the input of the op-amp. This state is maintained long enough to allow the capacitor to be charged to a voltage substantially close to the voltage which would be present across the capacitor, had it previously been in the feedback path. Once the capacitor is pre-charged, the second switch is opened and the first switch is closed, connecting the capacitor to the input of the op-amp. By pre-charging the capacitor, the input of the op-amp is not presented with the output voltage of the op-amp, rather it is presented with a voltage close to what would be across the capacitor had it been in the feedback path. This substantially eliminates the distortions caused switching the capacitor into the feedback path.

DETAILED DESCRIPTION OF THE INVENTION

Figure 1A:
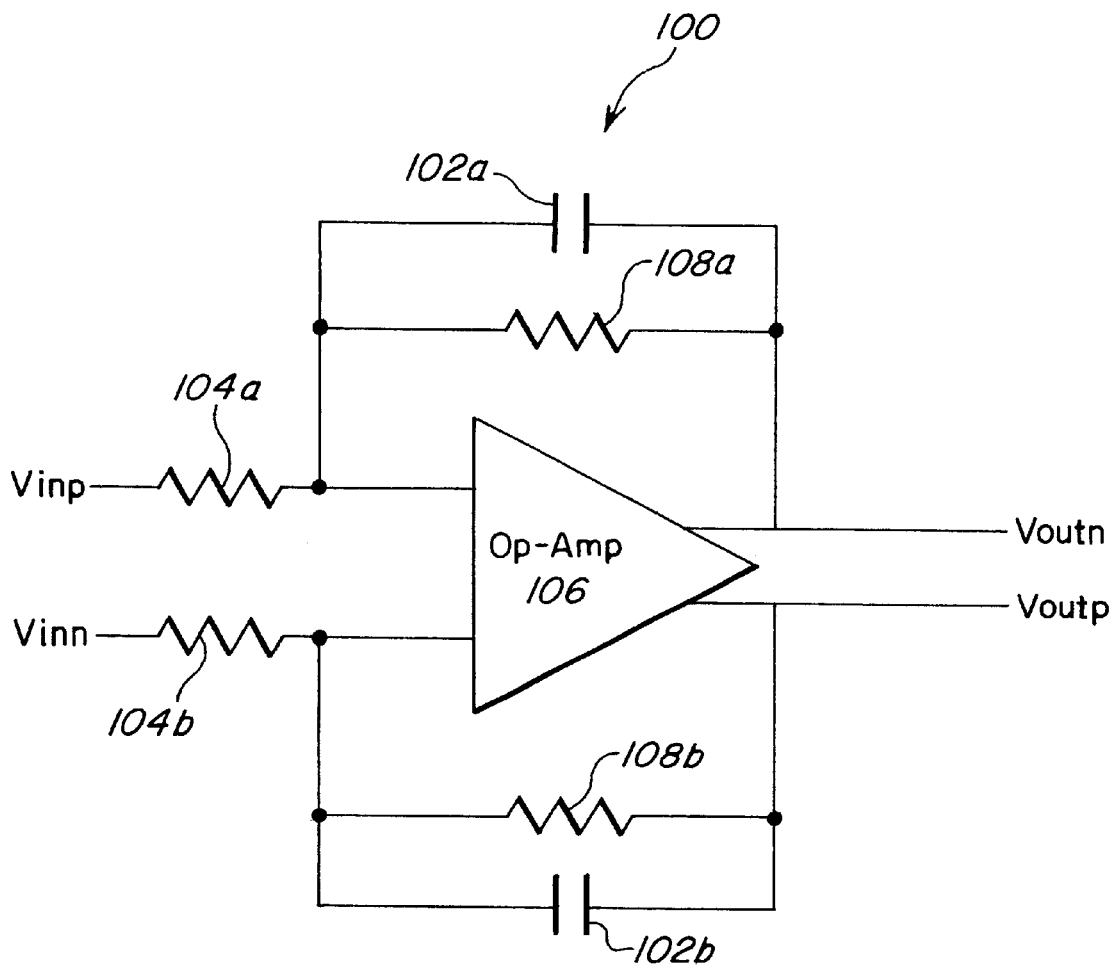
FIGS. 1a and 1b illustrate typical prior art active RC filters.
Figure 1B:
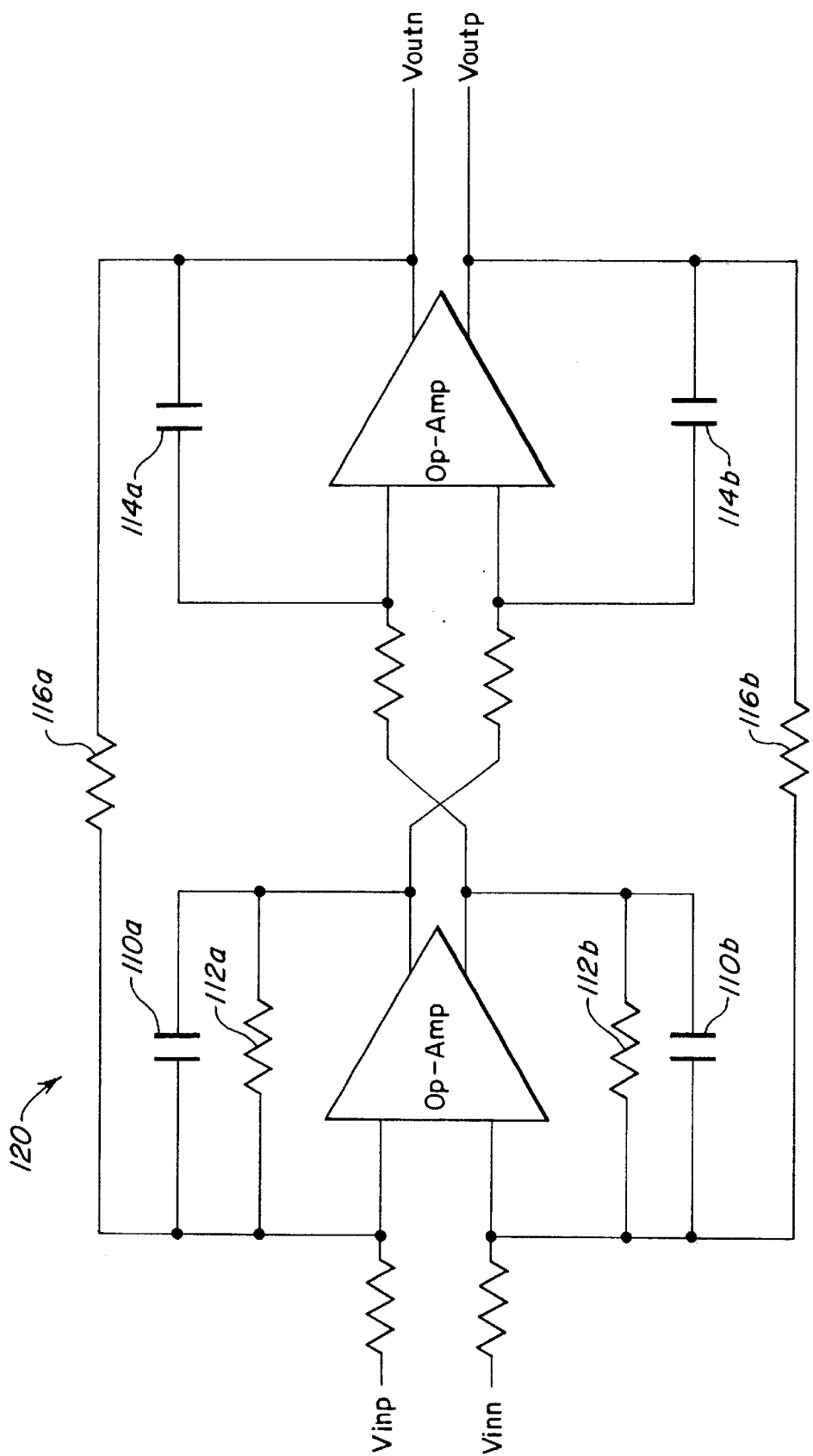
Figure 2:
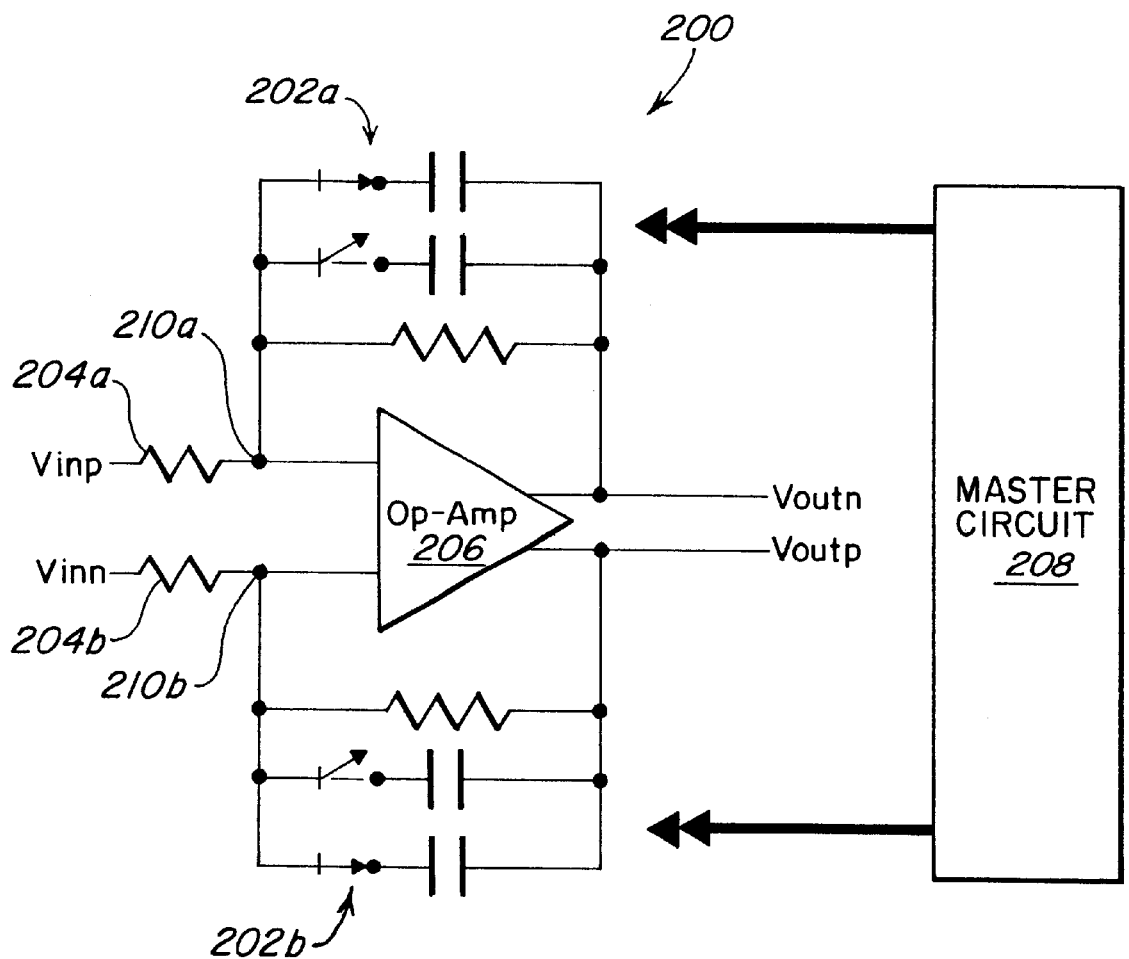
FIG. 2 illustrates a typical prior art capacitor array tunable active RC filter.
Figure 3:
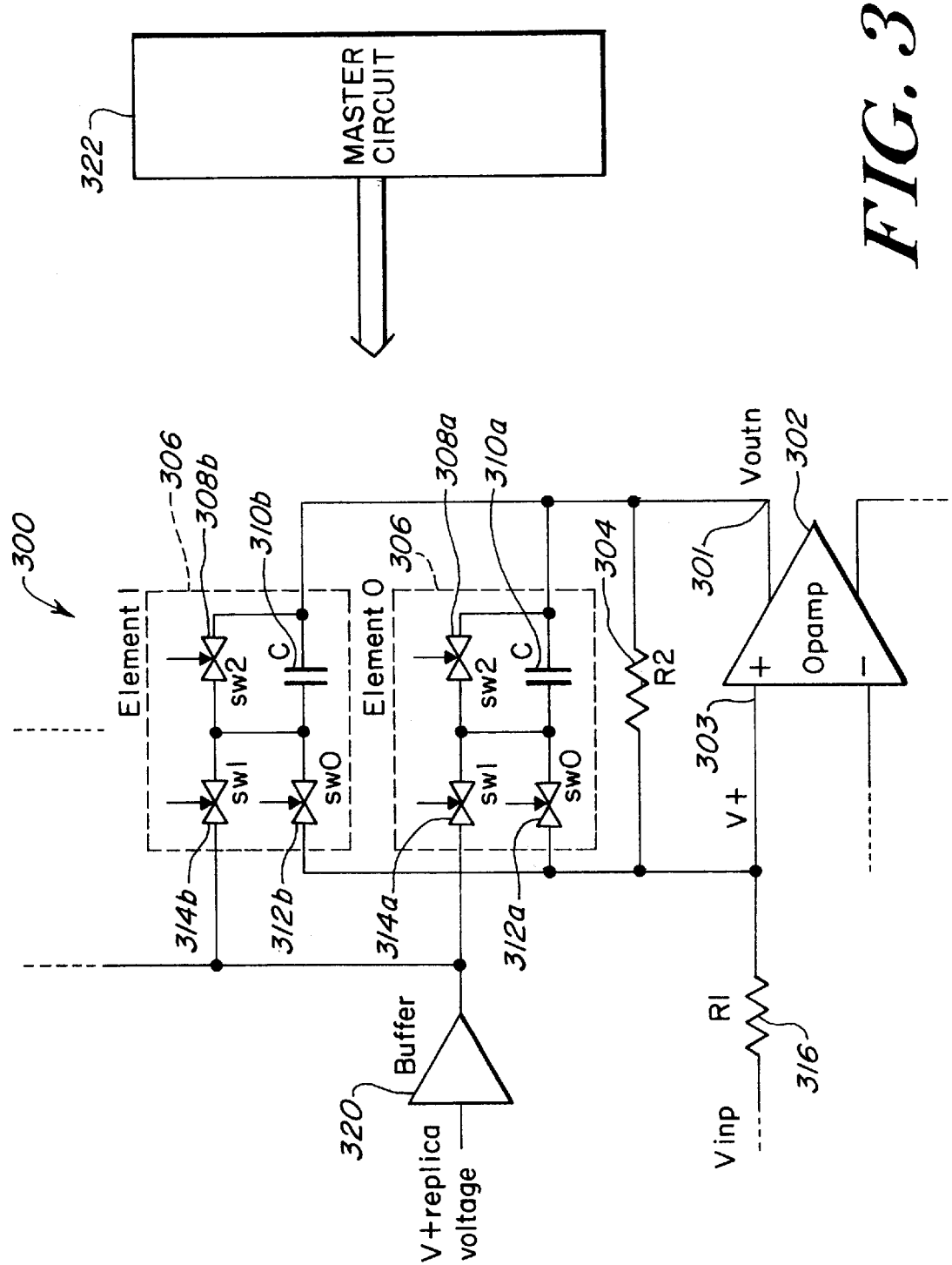
FIG. 3 illustrates a tunable active RC filter according to the principles of the present invention.

FIG. 3 illustrates one side of a differential one-pole active RC filter 300 in accordance with the present invention. Active RC filter 300 generally comprises an op-amp 302 having an output 301 and an input 303, a first resistor 316, a second resistor 304 and a plurality of parallel capacitors in an array 310a, 310b. First resistor 316 has a first terminal connected op-amp input 303 and a second terminal connected to a filter input voltage Vinp. Second resistor 304 has a first terminal connected to op-amp output 301 and a second terminal connected to op-amp input 303.

As with prior art capacitor array tunable active RC filters, the time constant of active RC filter 300 of the present invention is determined by the product of the value of resistor 304 located in the feedback path of op-amp 302 times the capacitance value of the capacitors 310a, 310b (assuming each capacitor having equal values of capacitance) times the number of parallel capacitors switched into the feedback path of op-amp 302. Therefore, by changing the number of capacitors switched into the feedback path, the time constant of filter 300 is changed, allowing the frequency characteristics to be tuned to the nominal design characteristics.

In the present invention, a master circuit 322 is utilized to effect tuning of active filter 300 by generating a digital signal which represents the number of capacitors in the array which need to be switched in and out. The number of capacitors to be switched in and out is determined, as in the prior art, by comparing a replica circuit's time constant with a stable reference clock, or, by any suitable method of determining the amount of error in the time constant of filter 300. In the present invention, preferably, a logic circuit prevents more than one capacitor to be switched in or out of the feedback path at a time. Even though the capacitors are switched one at a time, it is still possible to properly adjust the filter because temperature and power supply variations are normally slow relative to the time constant of filter 300.

The present invention eliminates the prior art distortions introduced when capacitors are switched in and out of the feedback path of op-amp 302. As the switching in and out of each of capacitors 310a, 310b is the same, the following discussion will only be made with respect to switching a single capacitor. To switch a capacitor in and out, a first switch 312a, a second switch 314a and a third switch 308a are utilized. Capacitor 310a has a first terminal connected to op-amp output 302. First switch 312a is connected between a second terminal of capacitor 310a and op-amp input 303. Second switch 314a is connected between the second terminal of capacitor 310 and a replica of the voltage V+ present at op-amp input 303, which is buffered via buffer 320. Third switch 308a is connected between the first and second terminals of capacitor 310a.

Figure 4:
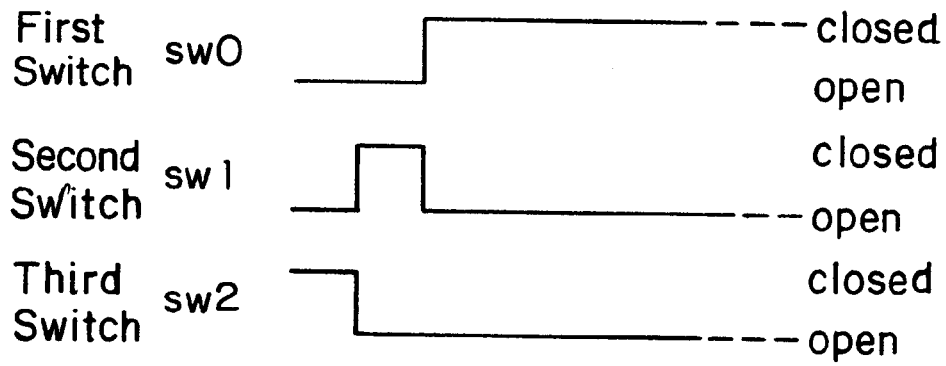
FIG. 4 illustrates the timing of the switches for switching a capacitor in and out of the op-amp feedback path of the active RC filter according to the principles of the present invention.
Figure 4:
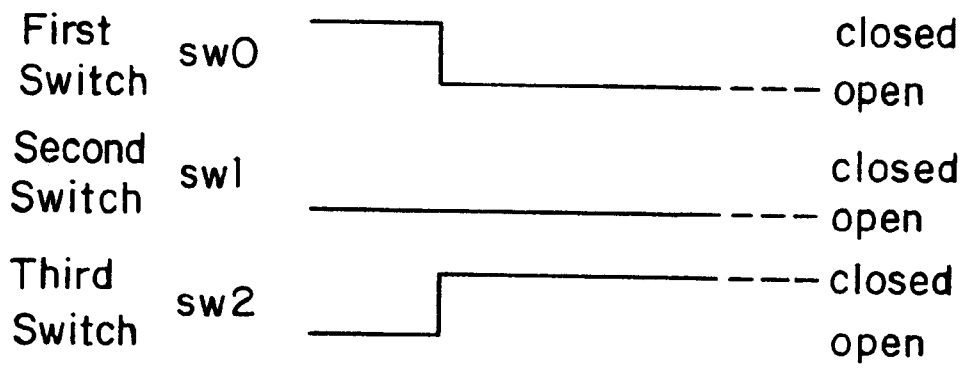

As illustrated in FIG. 4, prior to capacitor 310a being switched into the feedback path of op-amp 302, third switch 308a is closed, shorting capacitor 310a, while both first switch 312a and second switch 314a are open. In response to a digital signal from master circuit 322 causing capacitor 310a to be switched into the feedback path of op-amp 302, third switch 308a is opened, while at the same time second switch 314a is closed. By opening third switch 308a and closing second switch 314a, capacitor 310a is switched to the buffered replica of op-amp input voltage V+. By switching capacitor 310a to the buffered replica voltage, capacitor 310a is charged to a voltage near that which would be present had capacitor 310a already been in the feedback path. Buffer 320 speeds up the pre-charging of capacitor 310a to the replica voltage, before it is switched into the feedback path. After maintaining second switch 314a closed and first and third switches 312a, 308a open for a period of time to charge capacitor 310a, second switch 314a is opened and capacitor 310a is switched into the feedback path of op-amp 302 by opening second switch 314a and closing first switch 312a. By closing first switch 312a, capacitor 310a is connected between op-amp output 302 and op-amp input 303. However, when capacitor 310a is connected to op-amp input 303, the output voltage Voutn of the op-amp is not presented to the op-amp input, as capacitor 310a is pre-charged to the voltage that would be present on capacitor 310a, if it was already connected to op-amp input 303. By pre-charging capacitor 310a prior to switching it into the feedback path, distortions which are generated by presenting a differential op-amp input 303 with the differential output voltage of op-amp 302 are substantially eliminated.

At times, in order to adjust the time constant, a capacitor needs to be switched out of the feedback path. When capacitor 310a is in the feedback path, first switch 312a is closed, while second switch 314a and third switch 308a are open. In response to a digital signal from master circuit 322 causing capacitor 310a to be switched out of the feedback path, first switch 312a is opened, removing capacitor 310a from the feedback path. At substantially the same time, third switch 308a is closed, shorting out capacitor 310a (thereby discharging it).

Although the present invention has been shown and described with respect to several preferred embodiments thereof, various changes, omissions and additions to the form and detail thereof, may be made therein, without departing from the spirit and scope of the invention. While illustrated with a typical one-pole active RC filter, the present invention is not limited thereto, however, can be applied to any active RC filter which utilizes capacitors in the feedback around the amplifier(s). In addition, while demonstrated with a differential active RC filter, the present invention is equally applicable to single-ended active RC filters.

What is claimed is:

1. A tunable active filter comprising:
   an operational amplifier having an input and an output;
   a first resistor connected to said input;
   a second resistor connected between said input and said output;
   an array of tuning elements connected between said input and said output, each of said tuning elements comprising:
      a capacitor connected between said output and a first node;
      a first switch connected between said first node and said input;
      a second switch connected between said first node and an output of a buffer, said buffer receiving a replica of said input of said operational amplifier, and
      a third switch connected between said first node and said output.

2. A tunable active filter, as per claim 1, said active filter further comprising:
   a master circuit, said master circuit determining a number of said tuning elements to be activated to tune said filter, said master circuit causing each of said number of said tuning elements to be activated, said number of tuning elements initially in an inactivated state in which said first switch is open, said second switch is open, and said third switch is closed, each of said number of tuning elements activated by:
      opening said third switch and closing said second switch to pre-charge said capacitor, and
      opening said second switch and closing said first switch to connect said pre-charged capacitor between said input and said output.

3. A tunable active filter, as per claim 2, wherein each of said number of said tuning elements is activated one at a time until all of said number of said tuning elements are activated.

4. A tunable active filter, as per claim 3, wherein said master circuit further determines a number of said tuning elements to be de-activated to tune said filter, said master circuit causes each of said number of said tuning elements to be de-activated, said number of tuning elements initially in an activated state in which said first switch is closed, said second switch is open, and said third switch is open, each of said number of tuning elements de-activated by opening said first switch and closing said third switch.

5. A circuit providing a tunable active RC filter having reduced distortions when switching capacitors to effect tuning of said RC filter, said circuit comprising:
   an operational amplifier having an input and an output;
   a first resistor connected to said input;
   a second resistor connected between said input and said output;
   a capacitor connected between said output and said input via a first switch and connected between said output and a buffered replica of a voltage at said input via a second switch;
   wherein when said circuit is in a first state, said first switch and said second switch are in an open state;
   when said circuit is in a second state, said first switch is in an open state and said second switch is in a closed state connecting said capacitor to said buffered replica of a voltage at said input, pre-charging said capacitor, and
   when said circuit is in a third state, said second switch is in an open state and said first switch is in a closed state connecting said pre-charged capacitor to said input.

6. A circuit providing a tunable active RC filter having reduced distortions when switching capacitors to effect tuning of said RC filter, as per claim 5, said circuit further comprising:
   a third switch connected between a first terminal of said capacitor and a second terminal of said capacitor;
   wherein, when said circuit is in said first state, said third switch is in a closed state, and
   when said circuit is in said second state or said third state, said third switch is in an open state.

7. A circuit providing a tunable active RC filter having reduced distortions when switching capacitors to effect tuning of said RC filter, as per claim 5, wherein said first state represents a first frequency characteristic state of said filter.

8. A circuit providing a tunable active RC filter having reduced distortions when switching capacitors to effect tuning of said RC filter, as per claim 7, wherein said second state represents a pre-charging state of said filter.

9. A circuit providing a tunable active RC filter having reduced distortions when switching capacitors to effect tuning of said RC filter, as per claim 8, wherein said third state represents a modified frequency characteristic state different from said first frequency characteristic state.

10. A circuit providing a tunable active RC filter which is tuned by adjusting an RC time constant of said filter, said circuit comprising:
   an operational amplifier having an input at a first potential and an output at a second potential;
   a first resistor connected to said input;
   a second resistor connected between said input and said output;
   an array of switched capacitors connected between said output and said input, each capacitor of said array selectively switchable from a first state in which said capacitor is not connected between said output and input to a second state in which said capacitor is connected between said output and input so as to adjust a total capacitance of said array, and wherein each capacitor of said array is pre-charged to a voltage substantially equal to the difference between said first potential and said second potential prior to switching from said first state to said second state.

11. A circuit providing a tunable active RC filter which is tuned by adjusting an RC time constant of said filter, as per claim 10, said circuit further comprising:

a master circuit, said master circuit determining a number of said capacitors to be switched from said first state to said second state, said master circuit causing said number of capacitors to be switched from said first state to said second state, said capacitors switched one at a time until all of said number of capacitors are switched.

12. A circuit providing a tunable active RC filter which is tuned by adjusting an RC time constant of said filter, as per claim 11, wherein said master circuit further determines a number of said capacitors to be switched from said second state to said first state, said master circuit causes said number of capacitors to be switched from said second state to said first state, said capacitors switched one at a time until all of said number of capacitors are switched to said second state, each of said capacitors shorted in said second state.

13. A method of switching a plurality of capacitors so as to contribute to a total capacitance of a switchable array of capacitors connected between an output and an input of an operational amplifier in an active RC filter thereby adjusting the frequency characteristics of said active RC filter, said method comprising:

determining said plurality of capacitors of said array to be switched to contribute to said total capacitance so as to adjust the frequency characteristics of said active RC filter;

switching each of said plurality of capacitors one at a time until all of said plurality of capacitors are switched to contribute to said total capacitance, each of said plurality of capacitors switched by:

switching each capacitor from a shorted state to a state in which each capacitor is connected between said output of said operational amplifier having a first potential and a circuit node having a potential substantially equal to a potential present at said input of said operational amplifier thereby pre-charging each capacitor, and switching each pre-charged capacitor to a state in which each capacitor is connected between said input and said output.

14. A method of switching at least one capacitor so as to contribute to a total capacitance of a switchable array of capacitors connected between an output and an input of an operational amplifier in an active RC filter thereby adjusting the frequency characteristics of said active RC filter, as per claim 13, wherein said circuit node is an output of a buffer receiving a replica of said potential present at said input of said operational amplifier.

15. A method of switching at least one capacitor so as to contribute to a total capacitance of a switchable array of capacitors connected between an output and an input of an operational amplifier in an active RC filter thereby adjusting the frequency characteristics of said active RC filter, as per claim 14, said method further comprising:

determining a plurality of capacitors of said array to be disabled to not contribute to said total capacitance so as to adjust the frequency characteristics of said active RC filter;

disabling each of said plurality of capacitors to be disabled, each of said plurality of capacitors disabled by:

disconnecting each capacitor from said input, and shorting each capacitor.

* * * * *